United States Patent [19]

Romania et al.

[11] Patent Number: 4,465,130

[45] Date of Patent: Aug. 14, 1984

[54] WIRE FORM HEAT EXCHANGE ELEMENT

[75] Inventors: Samuel R. Romania, Phoenixville; Grant M. Smith, Bryn Athyn, both of Pa.

[73] Assignee: Burroughs Corporation, Detroit, Mich.

[21] Appl. No.: 395,723

[22] Filed: Jul. 6, 1982

[51] Int. Cl.³ .......................... F28F 7/00; H01L 23/34
[52] U.S. Cl. ..................................... 165/185; 357/81; 361/389
[58] Field of Search ............... 165/185, 181, 182, 179, 165/80 B, 80 D; 174/16 HS, 35 TS; 24/263, 256, 205; 361/389; 211/120; 357/81

[56] References Cited

U.S. PATENT DOCUMENTS

| | | | |
|---|---|---|---|
| 1,146,117 | 7/1915 | Wolfe | 165/184 |
| 1,699,542 | 1/1929 | Murray | 165/183 |
| 2,238,532 | 4/1941 | Nothe | 211/120 |
| 3,372,741 | 3/1968 | Kaiser et al. | 165/185 |

FOREIGN PATENT DOCUMENTS 871071  6/1961  United Kingdom ............... 165/185

*Primary Examiner*—Albert W. Davis, Jr.
*Attorney, Agent, or Firm*—Francis A. Varallo; Edmund M. Chung; Kevin R. Peterson

[57] ABSTRACT

The present disclosure describes a heat exchange element for attachment to the external surface of a package containing an integrated circuit chip or die. The element has particular application in high density electronic packaging configurations, where space limitations severely curtail the volume which can be occupied thereby. The structure of the present element is such that both the effective cooling area per given volume and the heat transfer coefficient are maximized. Basically the element is an integral structure comprised of a generally helical wire form with substantially elliptic turns wrapped around a metallic plate in symmetrical fashion and in intimate contact with opposed edges of the latter. The wire form provides a plurality of parallel closely spaced-apart cylindrical sections capable of being disposed in an air stream for dissipating the heat generated in the integrated circuit package to which the element is attached.

9 Claims, 3 Drawing Figures

WIRE FORM HEAT EXCHANGE ELEMENT

CROSS REFERENCE TO RELATED APPLICATIONS

In copending application Ser. No. 375,491, now U.S. Pat. No. 4,421,161 for "Heat Exchanger for Integrated Circuit Packages" by Samuel R. Romania and Grant M. Smith there is described and claimed a wire form heat exchange device having a significantly different structure but similar thermal characteristics and performance to that of the present application. Both applications are assigned to the same assignee.

BACKGROUND OF THE INVENTION

An essential requirement for the operation of integrated circuits is the transfer of heat generated by the integrated circuit chip from the package itself to the external environment. The problem of heat dissipation is especially acute in high density packaging applications where the volume allotment for heat exchange media is extremely limited.

Commonly used heat exchange or heat sink devices for integrated circuit packages result from extrusions, stampings, and machined parts formed in a variety of shapes and configurations. However, because of size and volume constraints, none of these manufacturing methods yield devices which offer maximum effective cooling area for a given volume. The latter criterion is a prime factor in overall heat exchanger performance. Related to the effective cooling area of the device is its heat transfer coefficient factor. Here again, the above-mentioned devices do not maximize this characteristic. It is apparent that the heat that is transferred from the package to the ambient must overcome the thermal resistance of the heat exchanger itself. The largest component of the total resistance offered by the heat exchange device is designated film resistance and is inversely proportional to the surface area of the device. Stated another way, film resistance is the reciprocal of the product of the effective surface area and the convective heat transfer coefficient. Maximizing the latter factors, reduces the film resistance of the heat exchanger.

The present element accomplishes the foregoing with a simple, economical, volume effective structure. As compared with the device of the reference application, the present heat exchange element is even easier and less costly to manufacture, thereby further increasing its attractiveness in applications such as large scale computer systems, where considerable numbers of the elements are required.

SUMMARY OF THE INVENTION

In accordance with the present invention, a heat exchange element is provided for attachment to an integrated circuit chip carrier or package, for dissipating the heat generated by the chip during circuit operation. The heat exchange element of the present invention is comprised of two basic parts, namely, a wire form and a metallic retainer plate, which parts are assembled together to form an integral unit.

In an actual operative embodiment of the element, the wire form was constructed from a continuous length of wire formed into a helical coil with spaced-apart wraps or turns, each turn being substantially elliptic. The retainer plate is generally rectangular and has a plurality of spaced-apart cutouts or notches along the edges of two opposed sides along its perimeter. The latter defines the approximate cross section of the volume allotted to the heat exchanger.

In assembly of the element, the wire form is wrapped around the retainer plate in symmetrical fashion, such that the elliptical vertices at the extremities of the major axes of the wire form turns, lie within the respective plate notches in intimate contact therewith. The lower portions of the turns exhibit a pitched configuration relative to the upper turn portions which are oriented in rectangular fashion in conformance with the shape of the retainer plate. The plate provides both the desired spacing for the coil turns and increased rigidity. The wire form and the retainer plate may then be bonded together by any suitable method, such as reflow soldering, dip brazing or spot welding. As will be described in detail hereinafter, the retainer plate also serves to enhance the thermal effect of the wire form.

The heat exchange element of the present invention offers significant advantages over commonly employed heat exchange media. Thus, its low profile and minimal size make it useful in high density packaging applications. It provides maximum surface area and convective heat transfer coefficient for a given volume. Moreover, it provides minimum restriction to air flow in a forced air system, and is bidirectional with respect thereto. Also, it is easily attached to the integrated circuit package and imparts minimal thermal stress to the latter as a result of processing and other thermal excursions.

Other features and advantages of the heat exchange element of the present invention will become more apparent in the detailed description which follows.

DESCRIPTION OF THE PREFERRED EMBODIMENT

Figure 1:
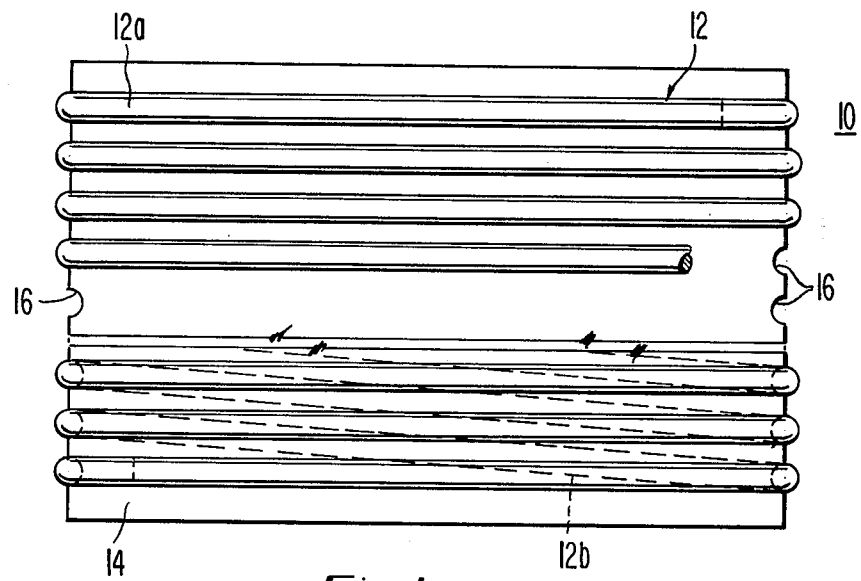
FIG. 1 is a plan view of the heat exchange element of the present invention.

Because of the close relationship of the figures, and the relative simplicity of the heat exchange element 10 of the present invention, specific reference should be made to FIG. 1, along with concurrent general reference to FIGS. 2 and 3 in the following description.

The element 10 is comprised of two parts, a wire form 12 and a retainer plate 14. In an actual operative embodiment, the wire form 12 was constructed of a continuous length of wire shaped into a coil having a plurality of spaced-apart turns. As seen particularly in FIG. 2, each turn of the coil exhibits a low-profile, generally elliptic configuration.

The retainer plate 14 is a rectangular, metallic member having a plurality of homologous spaced-apart cutouts 16 along the respective edges of two opposed sides of its perimeter. The perimeter of plate 14 defines the approximate cross section of the volume which may be occupied by the heat exchanger.

Figure 2:
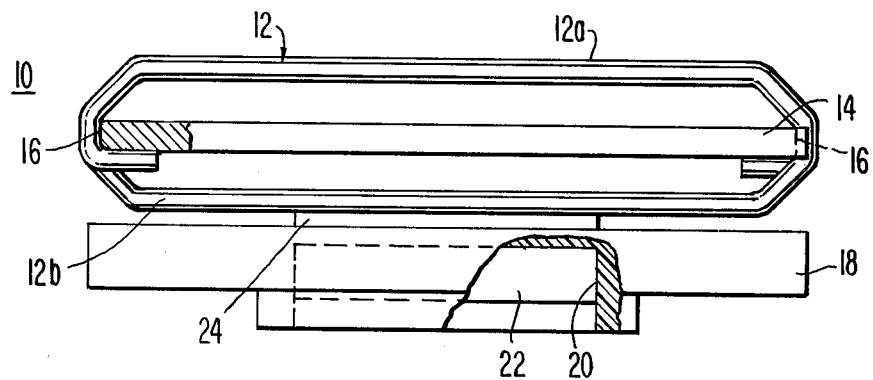
FIG. 2 is an end view of the heat exchange element of FIG. 1 shown attached to an integrated circuit package.
Figure 3:
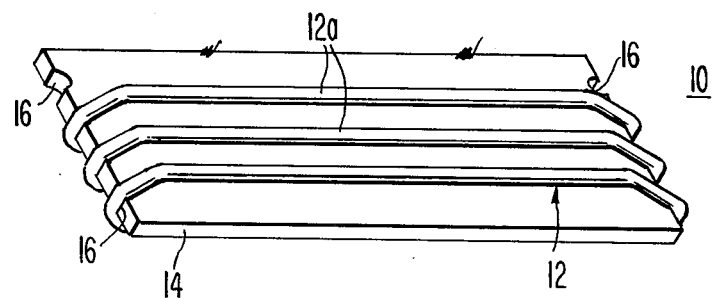
FIG. 3 is a pictorial view clearly illustrating a portion of the heat exchange element of FIG. 1.

As best seen in FIGS. 2 and 3, the heat exchange element 10 is assembled to the retainer plate by positioning the retainer plate 14 within a suitable mandrel (not shown) and wrapping the turns of the wire form 12 tightly around the plate 14. Upon removal of the mandrel, the plate 14 is symmetrically enclosed by generally elliptic turns, the upper and lower portions of which are identified respectively by reference numerals 12a and 12b. The vertices of the turns are disposed in the notches or cutouts 16. It is apparent that the cutouts 16 help to maintain the spacing of the coils, one from the other. As seen particularly in FIGS. 1 and 3, the lower turn portions 12b exhibit a pitched configuration relative to the upper turn portions 12a. As seen in FIG. 2, the dimensions of the minor axes of the turns are less than those which define a true elliptical shape, resulting in central sections of the respective outermost surfaces of both the upper and lower turn portions 12a and 12b, being flattened in a planar configuration. Accordingly, the last mentioned surfaces lie in respective planes parallel to that of the retainer plate 14. The wire form 12 and the retainer plate 14 may then be bonded together at the coil vertices by any suitable method, such as reflow soldering, dip brazing, or spot welding. The retainer plate 14 offers increased rigidity to the wire form 12.

FIG. 2 illustrates in simplified fashion, the heat exchange element 10 of the present invention attached to an integrated circuit package 18. The latter, commonly formed of ceramic, includes a cavity 20 within which the chip 22 is mounted. A metallized element 24 is shown bonded to the outer surface of the package 18. In practice the element 24 may be inlaid in the ceramic surface. In either case, the element 24 may extend across the entire surface of the package, or may be localized in the vicinity of the chip 22.

The heat exchange element 10 is attached to the metallized element 24. This is accomplished by bonding the lower turn portions 12b of the wire form 12 to the element 24 by soldering or the use of heat conductive adhesives. The heat generated by the chip 22 is conducted via the lower turn portions 12b to the retainer plate 14 which tends to distribute the heat to all of the upper turn portions 12a, thereby improving the bulk conduction of the device 10. It has been found that while the heat exchange element 10 may interface with a large metallization field, it induces minimal thermal stress on the package as a result of processing and temperature excursions.

The heat exchange element 10 of the present invention is especially suitable for forced air cooling—the upper turn portions 12a of the wire form 12 offering minimal resistance to air flow. It should be noted that as air passes over a heat exchanger with substantially flat surfaces, such as the known devices which are extruded, stamped or machined, a boundary layer adjacent the heat exchange surface is produced which affects the degree of heat dissipation. In contrast, the upper turn portions 12a of the wire form 12 of the present device appear as a multiplicity of parallel spaced-apart cylindrical members. Although the present device is bidirectional with respect to the direction of air flow, optimum results occur when the air stream is parallel to the coil axis of the wire form 12. This is true because air flow directed across members of circular cross section, cause a turbulent effect on the back side of each of the members, thereby improving the conditions for heat transfer. In effect, the turbulence breaks up the boundary layer effect noted hereinbefore, and increases the convective heat transfer coefficient.

In conclusion, it is submitted that the heat exchange element disclosed herein offers a low-cost, simple, highly efficient means of heat dissipation in a high density integrated circuit package configuration. The inventive concepts described herein are generic to various applications. In an actual operative situation, copper wire having a diameter of 0.042 inches was used for the wire form, while the copper retainer plate was approximately 0.80 inches square and had a thickness of 0.032 inches. The overall height of the heat exchanger was 0.27 inches. It should be understood that in other applications, changes and modifications of the foregoing parameters may be needed to suit particular requirements. Such variations as are within the skill of the designer, and do not depart from the true scope and spirit of the invention, are intended to be covered by the following claims.

What is claimed is:

1. A heat exchange element for an integrated circuit package comprising:
   a wire form having a plurality of spaced-apart turns, each of said turns exhibiting a substantially elliptic configuration,
   a retainer/heat distributor plate,
   said wire form being wrapped around said retainer plate in symmetrical fashion, the elliptical vertices of each of said wire form turns contacting the edges of two opposed sides along the perimeter of said retainer plate,
   said wire form and said retainer plate providing an integral element.

2. A heat exchange element as defined in claim 1 wherein said wire form is a continuous length of wire shaped into a helical coil.

3. A heat exchange element as defined in claim 2 wherein said retainer/heat distributor plate is a substantially planar rectangular member.

4. A heat exchange element as defined in claim 3 further characterized in that said edges of two opposed sides along the perimeter of said retainer/heat distributor plate include respective pluralities of homologous spaced-apart cutouts for receiving said elliptical vertices of each of said wire form turns, said cutouts establishing the spacing between said turns.

5. A heat exchange element as defined in claim 4 wherein the portions of said wire form turns on one side of said retainer/heat distributor plate exhibit a pitched configuration relative to the portions of said wire form turns on the opposite side of said retainer/heat distributor plate.

6. A heat exchange element as defined in claim 5 further characterized in that said wire form turns appear as a plurality of parallel spaced-apart cylindrical members to an air stream in which said element is operationally disposed.

7. A heat exchange element as defined in claim 6 further characterized in that the dimensions of the minor axes of said wire form turns are less than those which define true ellipses, thereby resulting in the respective outermost surfaces of said wire form turns being flattened in planar configurations, said last mentioned surfaces lying in respective parallel planes relative to the planar surfaces of said retainer/heat distributor plate.

8. A heat exchange element as defined in claim 7 wherein said wire form and said retainer/heat distributor plate are both formed of copper.

9. A heat exchange element as defined in claim 8 wherein said vertices of said wire form turns are affixed to said retainer/heat distributor plate.

* * * * *